(12) United States Patent
Ashida

(10) Patent No.: US 8,232,839 B2
(45) Date of Patent: Jul. 31, 2012

(54) SEMICONDUCTOR INTEGRATED CIRCUIT DEVICE AND TRANSMISSION AND RECEPTION SYSTEM

(75) Inventor: Mitsuyuki Ashida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 12/824,079

(22) Filed: Jun. 25, 2010

(65) Prior Publication Data

US 2011/0210788 A1   Sep. 1, 2011

(30) Foreign Application Priority Data

Mar. 1, 2010   (JP) .................................. 2010-044377

(51) Int. Cl.
*H03F 1/26* (2006.01)
(52) U.S. Cl. .......................................... 330/149; 330/51
(58) Field of Classification Search ................ 330/51, 330/149, 307
See application file for complete search history.

(56) References Cited

U.S. PATENT DOCUMENTS 5,523,716 A * 6/1996 Grebliunas et al. ........... 330/149
5,600,472 A * 2/1997 Uesaka .......................... 330/149
5,789,978 A * 8/1998 Zhang et al. .................. 330/149

FOREIGN PATENT DOCUMENTS

| JP | 2002-009555 | 1/2002 |
| JP | 2002 009555 A2 | 1/2002 |
| JP | 2002-076784 | 3/2002 |
| JP | 2002 076784 A2 | 3/2002 |
| WO | WO 2006-046294 A1 | 5/2006 |

OTHER PUBLICATIONS

Yamauchi et al., "Series Anti-Parallel Diode Linearizer for Class-B Power Amplifiers with a Gain Expansion," Dec. 2006, Proceedings of Asia-Pacific Microwave Conference.
Background Art Information.

* cited by examiner

*Primary Examiner* — Khanh V Nguyen
(74) *Attorney, Agent, or Firm* — Knobbe, Martens, Olsen & Bear LLP

(57) ABSTRACT

A semiconductor integrated circuit device comprising a linearizer that has a plurality of switchable first gain characteristics, the linearizer switching to the first gain characteristic to generate an intermediate signal from an input signal by using the switched first gain characteristic, and outputting the intermediate signal to a circuit having a second gain characteristic, wherein the linearizer includes: a linearization unit that has at least one of first rectifier, and linearizes the input signal; and a linearization reducing unit that has a plurality of second rectifiers having polarity opposite to polarity of the first rectifier and a first switching unit selecting at least one of the second rectifiers based on a control signal, the linearization reducing unit being connected in parallel to the linearization unit and reducing linearization of the input signal by the linearization unit.

20 Claims, 5 Drawing Sheets

SEMICONDUCTOR INTEGRATED CIRCUIT DEVICE AND TRANSMISSION AND RECEPTION SYSTEM

CROSS-REFERENCE TO RELATED APPLICATIONS

This application is based upon and claims the benefit of priority from the prior Japanese Patent Application No. 2010-044377, filed on Mar. 1, 2010; the entire contents of which are incorporated herein by reference.

BACKGROUND OF THE INVENTION

1. Field of the Invention

The present invention relates to a semiconductor integrated circuit device and a transmission and reception system.

2. Description of the Related Art

In recent years, according to the microminiaturization of devices, one chip including both analog and digital circuits is mainly used and higher integration of IC is advanced. At present, besides portable terminals, a large number of small applications such as game controllers employing radio systems emerge on the market. It is important to reduce power consumption to prevent a waste of batteries as much as possible. A micro-process is applied by product development to realize the lower power consumption and the high integration. Therefore, a reduction in voltage is advanced in high-frequency analog circuits used in the radio systems. In particular, in power amplifiers and the like required to have a liner gain characteristic, a fall in an amplitude margin due to lowering of power supply voltage is an extremely serious problem.

As a technique of obtaining a linear input and output characteristic, a technique of applying pre-distortion to a signal before being input into an amplifier to linearize a total gain characteristic is often used because the technique can be realized by a simple configuration. Above all, a linearizer including a diode is popular. It is possible to adjust a gain characteristic (an AM-AM characteristic) and a phase characteristic (an AM-PM characteristic) of the diode by changing a bias voltage applied to the diode.

Japanese Patent Application Laid-Open No. 2002-9555 discloses that, in a pre-distorter connected to an input side of an amplification element to apply pre-distortion, opposite bias voltages are respectively applied to two diodes having opposite polarities and connected in parallel to each other. Terminal voltages of the two diodes is controlled by freely controlling the opposite bias voltages applied to the two diodes. A position of a distortion start point of the pre-distorter can be adjusted. Consequently, according to Japanese Patent Application Laid-Open No. 2002-9555, only values of the opposite bias voltages are enough for parameters that should be controlled in adjusting a distortion characteristic of the pre-distorter. Therefore, it is possible to simplify adjustment of the distortion characteristic.

In the technique disclose in Japanese Patent Application Laid-Open No. 2002-9555, the opposite bias voltages applied to the two diodes can be freely controlled. For this reason, the technique requires two bias voltage sources that generate continuously-variable two opposite bias voltages having opposite signs. Moreover, to apply bias voltages having different signs to terminals on the earth side of the two diodes, direct current of the two diodes have to be interrupted. For this reason, the technique also requires large capacitance between the two diodes and the earth, respectively. Therefore, in the technique, an area of a circuit used for the adjustment of the distortion characteristic of the pre-distorter increases.

BRIEF SUMMARY OF THE INVENTION

According to a first aspect of the invention, there is provided a semiconductor integrated circuit device comprising a linearizer that has a plurality of switchable first gain characteristics, the linearizer switching to the first gain characteristic to generate an intermediate signal from an input signal by using the switched first gain characteristic, and outputting the intermediate signal to a circuit having a second gain characteristic, wherein the linearizer includes: a linearization unit that has at least one of first rectifier, and linearizes the input signal; and a linearization reducing unit that has a plurality of second rectifiers having polarity opposite to polarity of the first rectifier and a first switching unit selecting at least one of the second rectifiers based on a control signal, the linearization reducing unit being connected in parallel to the linearization unit and reducing linearization of the input signal by the linearization unit.

According to a second aspect of the invention, there is provided a semiconductor integrated circuit device comprising a linearizer that has a plurality of switchable first gain characteristics, and switches to the first gain characteristic to generate an intermediate signal from an input signal by using the switched first gain characteristic, and outputting the intermediate signal to a circuit having a second gain characteristic, wherein the linearizer includes: at least one first rectifier; a plurality of second rectifiers having polarity same as the first rectifier and being connected in parallel to the first rectifier; and a switching unit that selects at least one among the plurality of second rectifiers based on a control signal.

According to a third aspect of the invention, there is provided a transmission and reception system comprising: a linearizer that has a plurality of switchable first gain characteristics, and switches to the first gain characteristic to generate an intermediate signal from a modulated transmission signal or a reception signal to be demodulated; an amplifier that has a plurality of switchable second gain characteristics, and receives the intermediate signal; a detecting unit that detects a level of an output signal of the amplifier; and a control unit that controls the amplifier and the linearizer according to the level of the output signal of the amplifier, wherein the control unit generates, according to the level of the output signal of the amplifier detected by the detecting unit, a control signal for switching the first gain characteristic and the second gain characteristic in synchronization with each other, and the linearizer includes:

a linearization unit that has at least one first rectifier, and linearizes the transmission signal or the reception signal; and a linearization reducing unit that has a plurality of second rectifiers having polarity opposite to a polarity of the first rectifier and a first switching unit selecting at least one of the second rectifiers based on the control signal, and is connected in parallel to the linearization unit and reduces linearization of the transmission signal or the reception signal by the linearization unit.

DETAILED DESCRIPTION OF THE INVENTION

Exemplary embodiments of the present invention are explained in detail below with reference to the accompanying drawings. The present invention is not limited by the embodiments.

First Embodiment

Figure 1A:
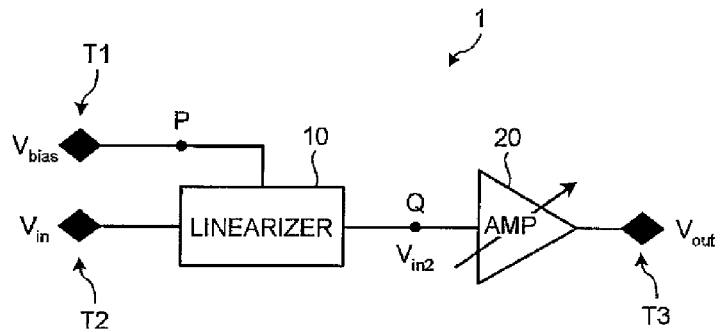
FIGS. 1A to 1D are diagrams of the configuration and the operation of a semiconductor integrated circuit device 1 according to a first embodiment of the present invention.

FIGS. 1A to 1D are diagrams of the configuration and the operation of a semiconductor integrated circuit device 1 according to a first embodiment of the present invention. FIG. 1A is a schematic diagram of the semiconductor integrated circuit device 1. A configuration example in which a linearizer is used in a nonlinear amplifier is shown in FIG. 1A.

The semiconductor integrated circuit device 1 includes a linearizer 10 and an amplifier 20. The linearizer 10 is connected to a terminal (a bias supply terminal) T1, a terminal T2, and a terminal Q. A predetermined (fixed) bias voltage Vbias is supplied to the terminal T1. The terminal T2 is an input terminal of the linearizer 10. An input signal Vin is supplied to the terminal T2. The terminal Q is an output terminal of the linearizer 10 and an input terminal of the amplifier 20. An intermediate signal Vin2 (of the semiconductor integrated circuit device 1) is supplied to the terminal Q from the linearizer 10.

The linearizer 10 performs processing of the input signal Vin based on the bias voltage Vbias supplied via the terminal T1 and generates the intermediate signal Vin2 to supply to the input terminal Q of the amplifier 20. The intermediate signal Vin2 is generated to linearize a gain characteristic of an output signal of the amplifier 20 with respect to the input signal Vin. The linearizer 10 supplies the generated intermediate signal Vin2 to the amplifier 20. The amplifier 20 amplifies the intermediate signal Vin2 and generates and outputs an output signal Vout.

The linearizer 10 has, as switchable gain characteristics, a plurality of first gain characteristics (FIG. 1B) having distortion levels different from one another in a direction opposite to a second gain characteristic of the amplifier 20 with respect to a liner gain characteristic. The linearizer 10 generates the intermediate signal Vin2 according to the first gain characteristic discretely switched according to a signal level output by the amplifier 20 to linearize its gain characteristic with respect to the input signal.

On the other hand, the amplifier 20 has, as switchable gain characteristics, a plurality of (nonlinear) second gain characteristics (FIG. 1C) having distortion levels different from one another with respect to a linear gain characteristic. The amplifier 20 performs amplification operation according to the second gain characteristic switched according to a level of the output signal of the amplifier 20, and generates and outputs a linearized output signal Vout. The output signal Vout is generated in a form in which the first gain characteristic and the second gain characteristic are offset. Consequently, a gain characteristic of the output signal Vout of the amplifier 20 with respect to the input signal Vin can be linearized (FIG. 1D).

In this way, the linearizer 10 performs processing for applying pre-distortion to a signal to be input into the amplifier 20 to thereby linearize a total gain characteristic of the linearizer 10 and the amplifier 20. In other words, a linear gain characteristic shown in FIG. 1D is obtained by synthesizing the second gain characteristic and the first gain characteristic having the distortion level in the opposite direction.

Figure 1B:
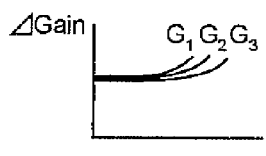
Figure 1C:
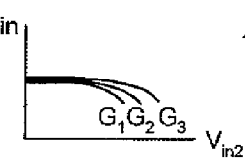
Figure 1D:
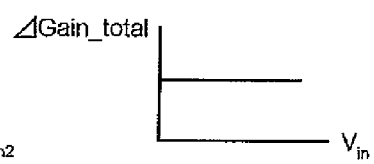

ΔGain shown in FIG. 1B (or FIG. 1C) is represented by the following formula:

$$\Delta \text{Gain} = \text{Gain}(VL)[\text{dB}] - \text{Gain}(VS)[\text{dB}] \qquad \text{Formula 1}$$

In Formula 1, VL represents a high input level of the input signal Vin (or the intermediate signal Vin2), VS represents a low input level of the input signal Vin (or the intermediate signal Vin2), and Gain(VL) and Gain(VS) represent gains.

Figure 2A:
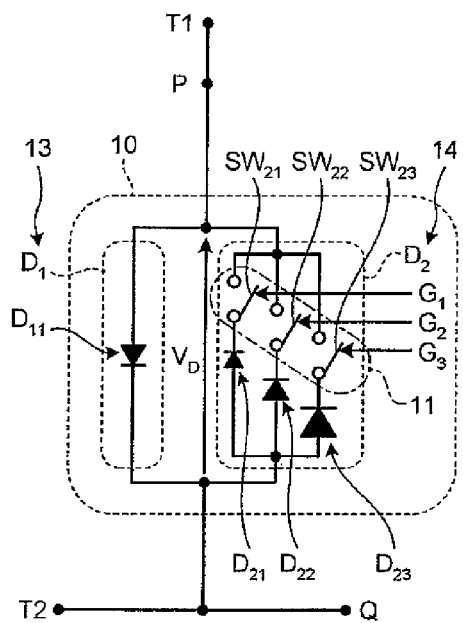
FIGS. 2A to 2D are diagrams of the configuration of a linearizer 10 in the first embodiment.

FIG. 2A is a circuit configuration diagram of the linearizer 10.

The linearizer 10 includes a linearization unit 13 and a linearization reducing unit 14, both of which are connected in parallel to each other. The linearization unit 13 functions as an equivalent diode D1. The linearization reducing unit 14 functions as an equivalent diode D2. The linearization unit 13 includes a first diode D11. The linearization reducing unit 14 includes a plurality of second diodes D21 to D23 having polarity opposite to that of the first diode D11 and connected in parallel to one another and a plurality of switches SW21 to SW23 (a first switching unit) respectively connected to the second diodes. The second diodes D21 to D23 have gains (sizes) different from one another.

In the linearization reducing unit 14, the switches SW21 to SW23 are controlled according to digital control signals G1 to G3 having discrete values so that any one of the diodes D21 to D23 can be selectively connected.

Figure 2B:
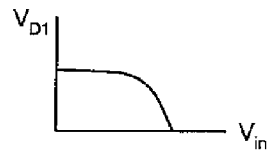
Figure 2C:
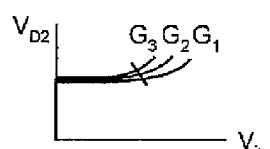
Figure 2D:
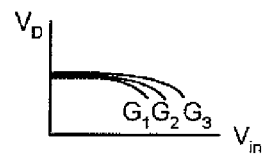

Specific operation in the configuration shown in FIG. 2A is explained. A bias voltage Vbias is applied to the terminal P side of the linearizer 10. The terminal Q side of the linearizer 10 is connected in shunt to a signal path (a path that connects the terminal T2 and the terminal Q). A DC voltage level between terminals P and Q is represented as VD and it is assumed that a level of the input signal Vin and a level of the intermediate signal Vin2 are equivalent to each other. When the level of the intermediate signal Vin2 at the terminal Q increases, the linearization unit 13 causes clipping because of a rectifying action of the equivalent diode D1 and acts to lower a DC voltage level VD1 between terminals P and Q (FIG. 2B). On the other hand, the linearization reducing unit 14 causes clipping because of a rectifying action of the equivalent diode D2 in the opposite direction to that of the equivalent diode D1 and acts to raise a DC voltage level VD2 between terminals P and Q (FIG. 2C). Therefore, contribution (VD1) of the DC voltage level VD to voltage fluctuation between terminals P and Q of the linearization unit 13 is reduced by voltage fluctuation between terminals P and Q (VD2) of the linearization reducing unit 14 (FIG. 2D). In other words, the linearization unit 13 operates to perform the above-described linearization. On the other hand, the linearization reducing unit 14 operates to reduce the above-described linearization.

If the amplifier 20 having a nonlinear gain characteristic includes a metal oxide semiconductor field effect transistor (MOSFET), a DC voltage level VG of a gate rises according to an increase in an input signal level. Therefore, it is possible to relax a non-linearization effect by adjusting VD fluctuation (ΔVD) of the linearizer 10 to suppress VG fluctuation (ΔVG) of a nonlinear amplifier.

The linearization reducing unit 14 includes diodes having different sizes (areas of PN junction surfaces). Therefore, it is possible to select a desired diode and adjust a suppression level of the VD fluctuation of the linearization unit 13. This makes it possible to adjust the VD fluctuation in the linearizer 10 in the first embodiment as a whole.

The linearizer 10 includes a first switching unit 11. The switching unit 11 electrically connects a desired diode to linearize the gain characteristic of the output signal Vout of the amplifier 20.

The linearizer 10 performs processing according to the first gain characteristic discretely switched by the switching unit 11.

The linearizer 10 processes the input signal Vin according to the first gain characteristic switched by the switching unit 11 to thereby generate the intermediate signal Vin2.

It is assumed that levels of the output signal Vout of the amplifier 20 are set to three stages, i.e., high, middle, and low levels. For example, when the output signal of the amplifier 20 is at a low level (a first level), the linearizer 10 switches the first gain characteristic thereof to a desired first gain characteristic according to the control signal G1 and outputs the intermediate signal Vin2. For example, when the output signal of the amplifier 20 is at an middle level (a second level), the linearizer 10 switches the first gain characteristic to a desired first gain characteristic according to the control signal G2 and outputs the intermediate signal Vin2. For example, in the case where the output signal of the amplifier 20 is at the middle level (i.e. in the case where the control signal G2 is active), the linearizer 10 discretely switch to the first gain characteristic having a larger distortion level compared with the case where the output signal of the amplifier 20 is at the low level (i.e. when the control signal G1 is active).

For example, in the case where the output signal of the amplifier 20 is at a high level (a third level), the linearizer 10 switches the first gain characteristic to a desired first gain characteristic according to the control signal G3 and outputs the intermediate signal Vin2.

More specifically, the linearizer 10 includes a plurality of rectifiers. The rectifiers include the first diode (a first rectifier) D11 and the second diodes (a plurality of second rectifiers) D21, D22, and D23. The first diode D11 has a third gain characteristic (FIG. 2B) opposite to the second gain characteristic with respect to the linear gain characteristic. A cathode of the first diode D11 is connected to the terminal T2 and the input terminal Q of the amplifier 20 and an anode thereof is connected to the bias supply terminal T1.

The second diodes D21, D22, and D23 have polarity opposite to that of the first diode D11 and are connected in parallel to one another and in parallel to the first diode D11. The second diodes D21, D22, and D23 can be selected according to the control signal. Consequently, it is possible to finely adjust a distortion level in the first gain characteristic by selectively switching the second diodes compared with a distortion level adjusted when a gain characteristic is switched to the first gain characteristics by using only the first diode D11.

The second diodes D21, D22, and D23 have a plurality of fourth gain characteristics (FIG. 2C) having different distortion levels from each other in the same direction as the second gain characteristics with respect to the linear gain characteristic. The second diodes D21, D22, and D23 have areas of PN junction surfaces (rectifying surfaces) different from one another. When the areas of the PN junction surfaces in the second diodes D21, D22, and D23 are respectively represented as A_D21, A_D22, and A_D23, a relation among the areas is represented by the following formula:

$$A\_D21 < A\_D22 < A_{13}D23 \qquad \text{Formula 2}$$

Anodes of the second diodes D21, D22, and D23 are connected to the terminal T2 and the input terminal Q of the amplifier 20 and cathodes thereof are connected to the bias supply terminal T1.

The first switching unit 11 selectively switches, according to the first gain characteristic discretely switched according to a level of the output signal Vout of the amplifier 20, so that a diode can be activated among the second diodes D21, D22, and D23. Specifically, the first switching unit 11 includes the switches SW21, SW22, and SW23 that connect the cathodes of the diodes D21, D22, and D23 and the bias supply terminal T1. When any one of the switches SW21, SW22, and SW23 is selectively on, the switch selectively connects any one of the cathodes of the diodes D21, D22, and D23 and the bias supply terminal T1. Consequently, the first switching unit 11 discretely switches a gain characteristic to a gain characteristic obtained by synthesizing the third gain characteristic and the fourth gain characteristic of the switched second rectifier (FIG. 2D). The gain characteristic shown in FIG. 2D and the gain characteristic shown in FIG. 1B are characteristics equivalent to each other, although the profiles are different because of their different ordinates.

It is assumed as above that levels of the output signal Vout of the amplifier 20 are set to three stages, i.e., high, middle, and low levels. For example, when the output signal of the amplifier 20 is at the low level (the first level), the linearizer 10 switches, as a second diode corresponding to the first gain characteristic to be switched, to a desired second diode according to the control signal G1, and outputs the intermediate signal Vin2. For example, when the output signal of the amplifier 20 is at the middle level (the second level), the linearizer 10 switches to a desired second diode according to the control signal G2 and outputs the intermediate signal Vin2. For example, in the case where the output signal of the amplifier 20 is at the middle level (i.e. when the control signal G2 is active), the linearizer 10 selectively switches to the second diode having a smaller area of the PN junction surface compared with the case where the output signal of the amplifier 20 is at the low level (i.e. the case where the control signal G1 is active) (Formula 2).

For example, in the case where the output signal of the amplifier 20 is at the high level (the third level), the linearizer 10 switches to a desired second diode according to the control signal G3 and outputs the intermediate signal Vin2.

Specifically, any one of the control signals G1 to G3 changes to an active level and the switch to which the control signal at active level is supplied among the switches SW1 to SW3 is selectively turned on. Consequently, any one of the second diodes D21 to D23 is activated and contributes to generation of the intermediate signal Vin2.

As explained above, according to the first embodiment, in the linearizer 10, the first switching unit 11 switches the second rectifier to be activated and switches to the first gain characteristic determined among the plurality of first gain characteristics to linearize the gain characteristic of the output signal Vout with respect to the input signal Vin. Consequently, the linearizer 10 for linearizing the gain characteristic of the output signal Vout with respect to the input signal Vin can be realized by a simple configuration. Because there is no needs for two bias voltage sources that generate continuously-variable opposite bias voltages, it is possible to reduce a circuit size of the linearizer 10. As a result, it is possible to reduce an area of a circuit necessary for linearizing the gain characteristic of the output signal Vout.

It is possible to discretely switch the first gain characteristic while supplying bias voltages of the same sign to the terminals on the terminal T1 side of the first diode and the second diodes. Therefore, it is unnecessary to interrupt the first diode and the second diodes in a DC manner and a capacitative element having a large capacitance value is unnecessary. Consequently, a capacitative element having a large area is unnecessary. Therefore, it is possible to reduce an area of a circuit necessary for linearizing a gain characteristic of an output signal of the amplifier 20 with respect to an input signal.

It should be noted that the first switching unit 11 may switch the numbers of second rectifiers to be activated instead of selectively switching a plurality of second rectifiers to be activated. Specifically, the first switching unit 11 selects, according to the discretely-switched first gain characteristic, a plurality of second rectifiers to be activated. Consequently, the first switching unit 11 can discretely switch to a gain characteristic obtained by synthesizing the third gain characteristic of the first rectifier and the fourth gain characteristics of the switched second rectifiers. The fourth characteristic corresponds to a gain characteristic obtained by adding up, in terms of an area, PN junction surfaces in one or more diodes to be activated among the second diodes. In this case, second diodes having substantially equivalent areas of PN junction surfaces can be present among the plurality of second diodes.

Second Embodiment

Figure 3:
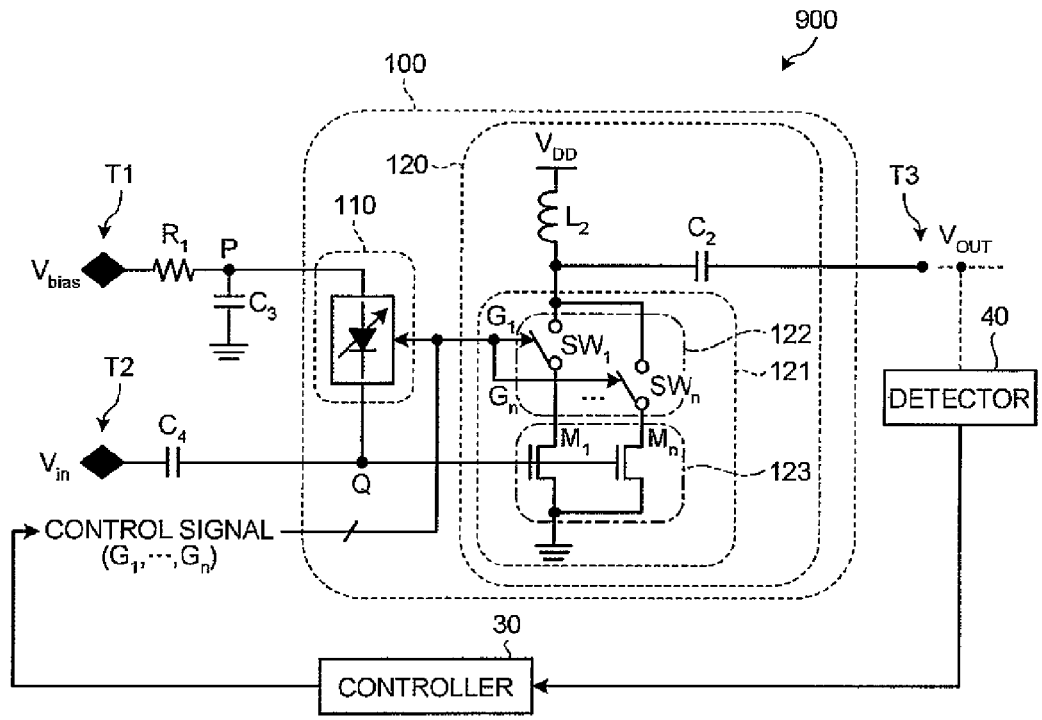
FIG. 3 is a diagram of the configuration of a semiconductor integrated circuit device 100 according to a second embodiment of the present invention and the configuration related to the semiconductor integrated circuit device 100 in a radio communication apparatus 900 to which the semiconductor integrated circuit device 100 is applied.

FIG. 3 is a diagram of a radio communication apparatus 900 to which a semiconductor integrated circuit device 100 according to a second embodiment of the present invention is applied. Differences from the first embodiment are mainly explained below.

The radio communication apparatus (a transmission and reception system) 900 includes a linearizer 110, an amplifier 120, a detector (a detecting unit) 40, and a controller (a control unit) 30.

The detector 40 detects a level of the output signal Vout of the amplifier 120. The controller 30 controls the linearizer 110 and the amplifier 120 in synchronization with each other according to the level of the output signal Vout detected by the detector 40. Specifically, the controller 30 generates, according to the level of the output signal Vout detected by the detector 40, common control signals (G1, . . . , and Gn) for controlling a second gain characteristic and a first gain characteristic in synchronization with each other and supplies the control signals to the linearizer 110 and the amplifier 120, respectively.

It is assumed that levels of the output signals Vout that should be detected by the detector 40 are represented as a first detection level to an n-th detection level in order from a lowest level. In this case, for example, the controller 30 generates control signals for designating a gain characteristic having a large distortion level when the output signal Vout detected by the detector 40 is at a p-th detected level ($k<p\leq n$) compared with a distortion level of a gain characteristic designated when the output signal Vout is at a k-th detection level ($1\leq k<n$) and supplies the control signals to the linearizer 110 and the amplifier 120.

Specifically, the controller 30 supplies n-bit common control signals G1 to Gn to the linearizer 110 and the amplifier 120 to thereby control the linearizer 110 and the amplifier 120 in synchronization with each other. In the n-bit common control signals G1 to Gn, at least one bit of G1 to Gn is at an active level and the remaining bits are at an inactive level.

The amplifier 120 shown in FIG. 3 includes an amplifier core block 121, an inductor L2, and a capacitative element C2. The inductor L2 is connected between an output terminal of the amplifier core block 121 and a power supply voltage VDD. The capacitative element C2 is connected between a node and the terminal T3, the node being provided between the amplifier core block 121 and the inductor L2. The amplifier core block 121 includes an amplifying unit 123 that amplifies the input intermediate signal Vin2 and a switching unit 122 that receives the control signals G1 to Gn and switches the second gain characteristic. The amplifying unit 123 includes a plurality of transistors M1 to Mn and has switchable second gain characteristics. The switching unit 122 includes a plurality of switches SW1 to SWn for controlling the transistors M1 to Mn. The switches SW1 to SWn receive bit values corresponding to the control signals G1 to Gn and are turned on and off.

Figure 4:
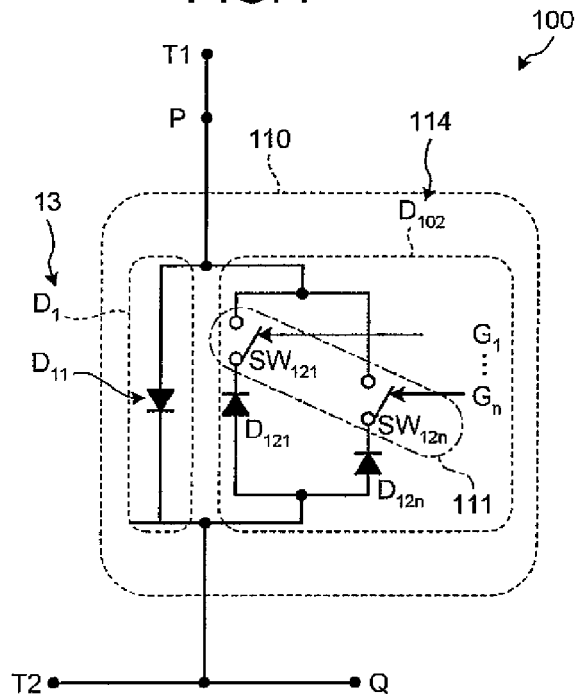
FIG. 4 is a diagram of the configuration of a linearizer in the second embodiment.

The linearizer 110 includes, as shown in FIG. 4, the linearization unit 13 and a linearization reducing unit 114, the linearization reducing unit 114 including n switches SW121 to SW12n (a first switching unit 111) and n second diodes D121 to D12n. The linearization reducing unit 114 functions as an equivalent diode D102. The n switches SW121 and SW12n receive the n-bit control signals G1 to Gn and control the n second diodes D121 to D12n. In the n switches SW121 to SW12n, at least one switch that receives a control signal at active level is turned on and the remaining switches are turned off. Consequently, when the switches SW121 to SW12n are switched to increase an area of the equivalent diode D102, a linearization effect is relaxed (i.e. the first gain characteristic is switched to the first gain characteristic having a relaxed distortion level).

It should be noted that the switches SW121 to SW12n can respectively include MOSFETs. Basically, ratios of PN junction surfaces in the MOSFETs can be set equivalent to those of the second diodes D121 to D12n. However, even if the ratios are not equivalent, the linearization effect in the first embodiment can be obtained. It is possible to suppress non-linearity of the switches themselves by inserting resistors in gates of the switches.

Figure 5:
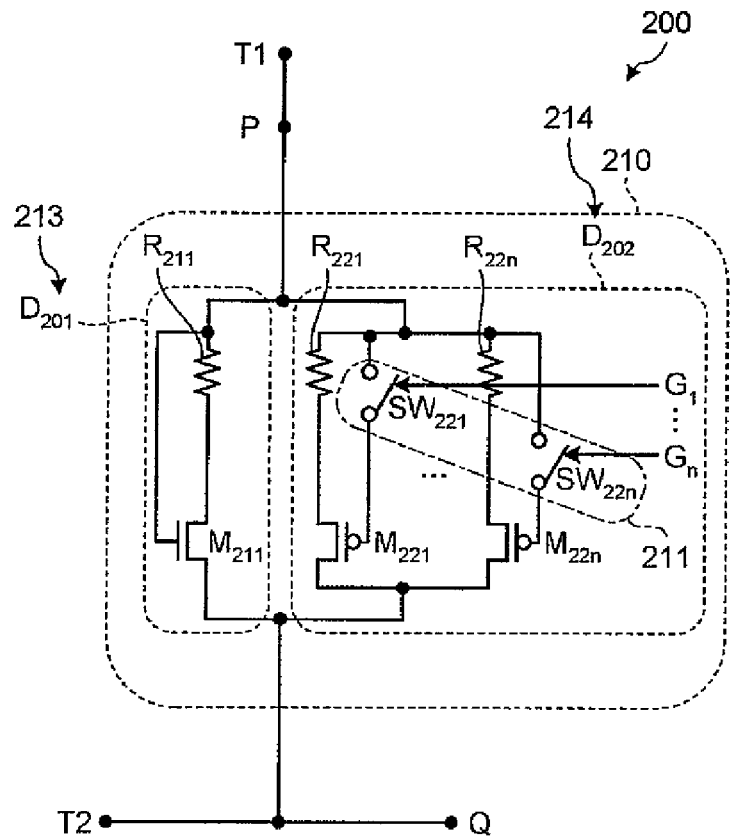
FIG. 5 is a diagram of the configuration of a semiconductor integrated circuit device 200 according to a modification of the second embodiment.

It should be also noted that, in the linearizer 110, the similar effect can be obtained even if, besides the diodes, FET transistors or bipolar transistors are used as the rectifiers. For example, a linearizer 210 shown in FIG. 5 includes a linearization unit 213 functioning as an equivalent diode D201 and a linearization reducing unit 214 functioning as an equivalent diode D202. The linearization unit 213 includes an NMOS transistor M211 and a resistor R211. The linearization reducing unit 214 includes a plurality of PMOS transistors M221 to M22n, a plurality of resistors R221 to R22n, and a plurality of switches SW221 to SW22n. A gate of the NMOS transistor M211 is connected to a terminal P, a drain thereof is connected to the terminal P via the resistor R211, and a source thereof is connected to a terminal Q. Gates of the PMOS transistors M221 to M22n are connected to the terminal P via the switches SW221 to SW22n, sources thereof are connected to the terminal P via the resistors R221 to R22n, and drains thereof are connected to the terminal Q.

Figure 6:
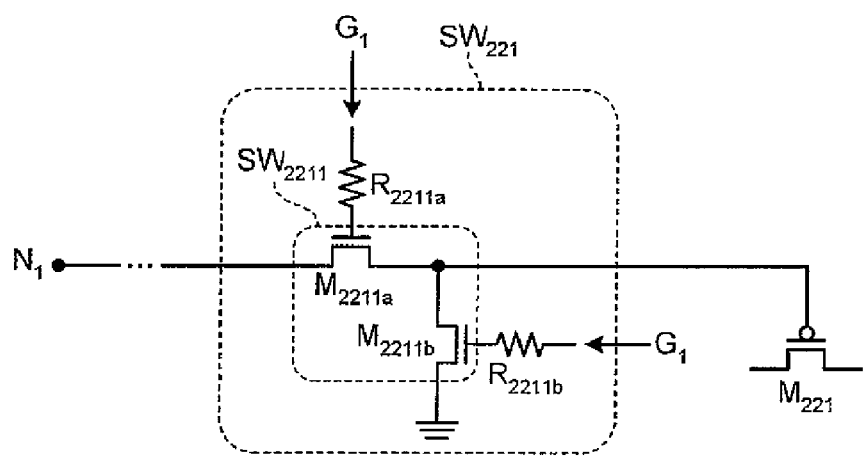
FIG. 6 is a diagram of the configuration of a switch in the modification of the second embodiment.

In the case where the linearizer 110 includes FET transistors, as shown in FIG. 6, or bipolar transistors, each of the switches SW221 to SW22n can incorporate a transistor M2211a connected in series to a gate (or a base) and a transistor M2211b connected in shunt to the gate (or the base). An on and off effect of the transistors themselves can be sufficiently obtained by configuring the switches in this way. It is possible to suppress nonlinearity of the switches themselves by inserting resistors in gates of the switches.

The amplifier 120 can be realized by using not only NMOS FET transistors shown in FIG. 3 but also PMOS FET transistors. When the PMOS FET transistors are used, the amplifier 120 can be realized by inverting all polarities of the linearizer 110 shown in FIG. 3. The amplifier 120 can also be realized by using bipolar transistors besides the FET transistors.

Third Embodiment

Figure 7:
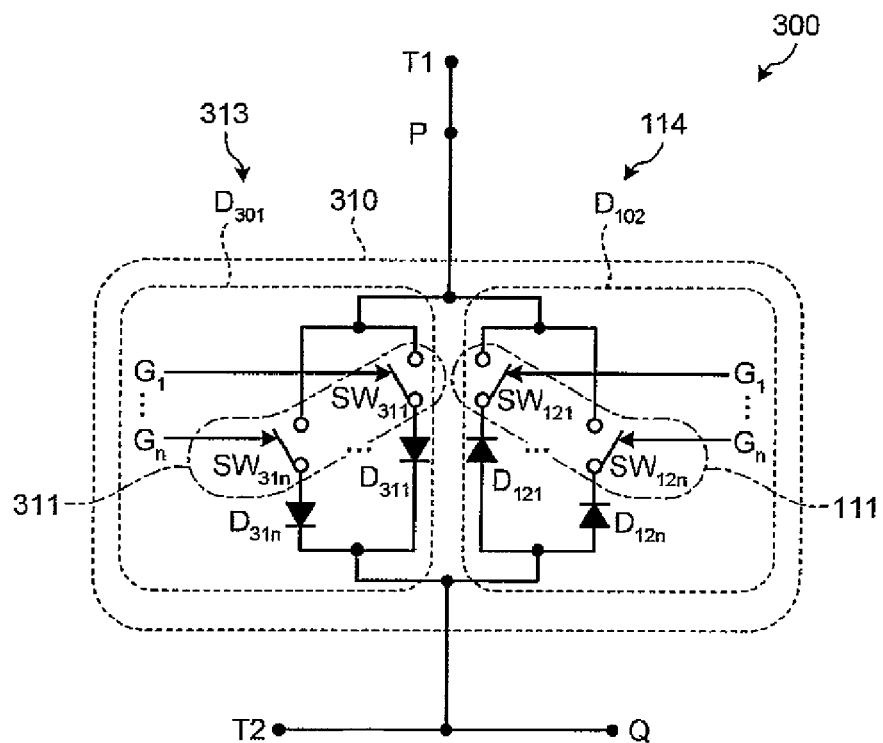
FIG. 7 is a diagram of the configuration of a linearizer 310 in a semiconductor integrated circuit device 300 according to a third embodiment of the present invention.

FIG. 7 is a diagram of a linearizer 310 according to a third embodiment of the present invention. Differences from the second embodiment are mainly explained below. The third embodiment is different from the second embodiment in that a linearization unit 313 functioning as an equivalent diode D301 includes switched diodes, like the linearization reducing unit 114 functioning as the equivalent diode D102.

The linearizer 310 includes the linearization unit 313 including n switches SW311 to SW31n (a second switching unit 311) and n first diodes (first rectifiers) D311 to D31n and the linearization reducing unit 114 including n switches SW121 to SW12n (the first switching unit 111) and n second diodes (second rectifiers) D121 to D12n. The n switches SW311 to SW31n receive n-bit control signals G1 to Gn and control the n first diodes D311 to D31n. In the n switches SW311 to SW31n, at least one switch that receives a control signal at active level is turned on and the remaining switches are turned off.

In this case, if the switching operations are performed such that an area of an active PN junction surface in the equivalent diode D102 is large relatively to an area of an active PN junction surface in the equivalent diode D301, a linearization effect is relaxed (i.e. switched to the first gain characteristic having a relaxed distortion level). For example, the first diodes D311 to D31n have areas of PN junction surfaces (rectifying surfaces) different from one another. Specifically, when the areas of the PN junction surfaces in the first diodes D311 to D31n are respectively represented as A_D311 to A_D31n, a relation among the areas are represented by the following formula:

$$A\_D311 < \ldots < A\_D31n \quad \text{Formula 3}$$

Anodes of the first diodes D311 to D31n are connected to the terminal T2 and the input terminal Q of the amplifier 120 and cathodes thereof are connected to the bias supply terminal T1.

As explained above, according to the third embodiment, a first rectifier to be activated is switched and a second rectifier to be activated is switched. Therefore, it is possible to more finely perform discrete adjustment and switching of the first gain characteristic. In other words, finer adjustment of the linearization effect can be performed.

Fourth Embodiment

Figure 8:
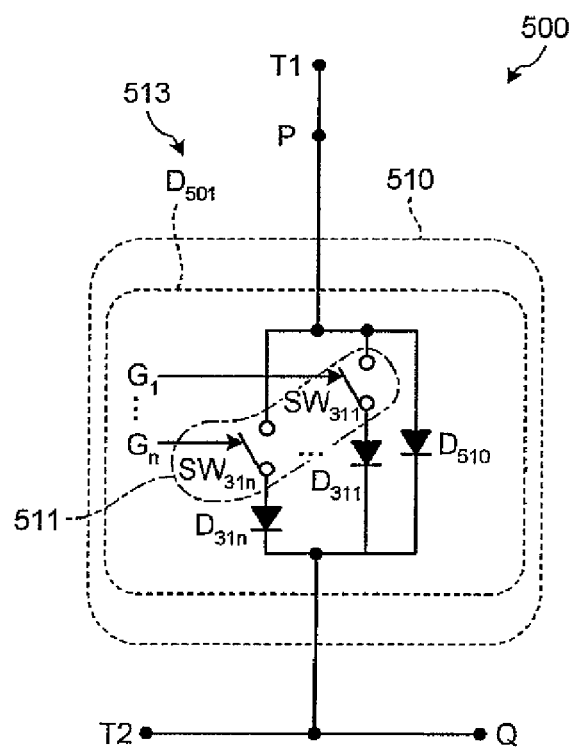
FIG. 8 is a diagram of the configuration of a linearizer 510 in a semiconductor integrated circuit device 500 according to a fourth embodiment of the present invention.

FIG. 8 is a diagram of a linearizer 510 according to a fourth embodiment of the present invention. Differences from the third embodiment are mainly explained.

The linearizer 510 does not include the linearization reducing unit 114 and includes a linearization unit 513 including the n switches SW311 to SW31n (a switching unit 511), the n first diodes (second rectifiers) D311 to D31n, and a third diode (at least one rectifier) D510. The n first diodes D311 to D31n and the third diode D510 are connected in the same polarity and in parallel. The n first diodes D311 to D31n are connected to the n switches SW311 to SW31n and selectively switched according to the control signal.

In the fourth embodiment, the third diodes D510 having a size enough for obtaining a maximum linearization effect is always on except during power-down. If the n first diodes D311 to D31n are switched such that an area of the equivalent diode D501 is larger in accordance with switching of a gain characteristic, a linearization effect is relaxed (switched to the first gain characteristic having a relaxed distortion level).

It should be noted that the rectifiers of the linearizer 510 can include NMOS transistors. In this case, it is possible to configure the linearizer 510 without using PMOS transistors. Therefore, it is easy to reduce an area of the linearizer 510.

Fifth Embodiment

Figure 9:
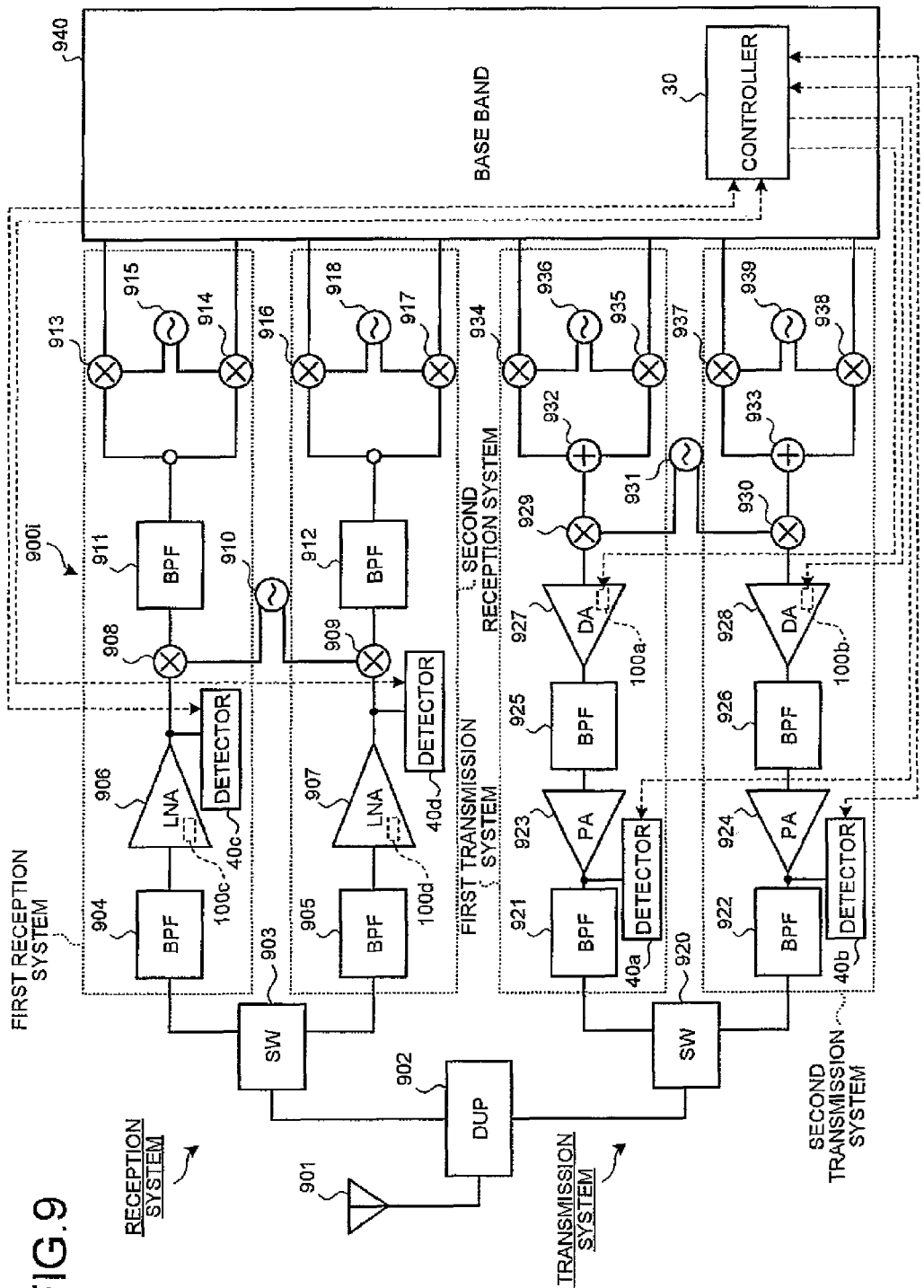
FIG. 9 is a diagram of a configuration example of a radio communication apparatus 900i to which the semiconductor integrated circuit devices according to the first to fourth embodiments are applied.

FIG. 9 is a diagram of an exemplary configuration of a radio communication apparatus 900i to which the first to fourth embodiments are applied. The radio communication apparatus (a transmission and reception system) 9001 includes a transmission system circuit and a reception system circuit in two lines. In FIG. 9, reference numeral 901 denotes an antenna, 902 denotes a duplexer, 903 and 920 denote switches (SWs), 904, 905, 911, 912, 921, 922, 925, and 926 denote band-pass filters (BPFs), 906 and 907 denote low-noise amplifiers (LNAs), 908 and 909 denote down converters, 910, 915, 918, 931, 936, and 939 denote synthesizers, 913, 914, 916, and 917 denote demodulators, 923 and 924 denote power amplifiers (PAs), 927 and 928 denote driver amplifiers (DAs), 929 and 930 denote up-converters, 932 and 933 denote adders, 934, 935, 937, and 938 denote orthogonal modulators, and 940 denotes a baseband circuit.

In the radio communication apparatus 900i, any one of the first to fourth embodiments is applied to the driver amplifiers 927 and 928 and the low-noise amplifiers 906 and 907. Levels of output signals of the driver amplifiers 927 and 928 are detected by detectors 40a and 40b (corresponding to the detector 40 shown in FIG. 2). Levels of output signals of the low-noise amplifiers 906 and 907 are detected by detectors 40c and 40d (corresponding to the detector 40 shown in FIG. 2).

The baseband circuit 940 includes the controller 30. The controller 30, for example, determines a distance from a base station to the radio communication apparatus 900i, according to the levels of the output signals detected by the detectors 40c and 40d. The controller 30 adjusts transmission power, i.e., a level of a transmission signal according to the distance from the base station to the radio communication apparatus 900i.

Consider a case where a linearizer in a semiconductor integrated circuit device of a transmission system fixedly uses only the same diode. In this case, it is attempted to linearize a gain characteristic of the amplifier even in a case where a level of its output signal is low, in a manner similar to the case where a level of its output signal is high. Therefore, linearity of a gain characteristic of an output signal of the amplifier with respect to an input signal in the semiconductor integrated circuit device is deteriorated.

On the other hand, in the fifth embodiment, the controller 30 performs, to obtain a target level of a transmission signal, control to switch a second gain characteristic used by the amplifier and a first gain characteristic used by the linearizer in synchronization with each other. Consequently, the linearizer switches a rectifier to be activated among a plurality of rectifiers (diodes) to perform processing of an input signal using the first gain characteristic for offsetting the second gain characteristic of the amplifier and for thereby linearizing a gain characteristic of an output signal with respect to the input signal. As a result, it is possible to improve linearity of the gain characteristic of the output signal of the amplifier with respect to the input signal and improve performance of the radio communication apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device configured to generate an intermediate signal from an input signal according to a first switchable gain characteristic, and to output the intermediate signal to a circuit comprising a second gain characteristic, the device comprising:
    a linearizer configured to linearize the input signal, the linearizer comprising at least one first rectifier comprising a first polarity; and
    a reducer configured to reduce linearization of the input signal, the reducer comprising:
    a plurality of second rectifiers, each second rectifier comprising a second polarity opposite to the first polarity; and
    a first switch configured to select at least one of the rectifiers comprising the second polarity based on a control signal;
    wherein the reducer is connected in parallel to the linearizer.

2. The semiconductor device of claim 1, wherein:
    the circuit comprising the second gain characteristic comprises an amplifier configured to be switchable between a plurality of different distortion levels; and
    the first switch is further configured to switch the first switchable gain characteristic in synchronization with the second gain characteristic according to the control signal corresponding to a level of an output signal of the amplifier.

3. The semiconductor device of claim 1, wherein:
    the at least one first rectifier has a third gain characteristic and is configured to distort a first rectifier input in a manner opposite to a distortion profile of the second gain characteristic; and
    each rectifier of the plurality of second rectifiers has a fourth switchable gain characteristic, and is configured to distort a second rectifier input in a manner opposite to a distortion profile of the third gain characteristic.

4. The semiconductor device of claim 3, wherein:
    the plurality of second rectifiers comprising the fourth switchable gain characteristic is configured to be switchable between a plurality of different distortion levels; and
    the first switchable gain characteristic comprises a synthesis of the third gain characteristic and the fourth switchable gain characteristic of the at least one selected rectifier.

5. The semiconductor device of claim 4, wherein:
    each rectifier of the plurality of second rectifiers comprising the second polarity comprises a rectifying surface comprising an area that is different from the other rectifiers.

6. The semiconductor device of claim 5, wherein:
    the circuit comprising the second gain characteristic comprises an amplifier; and
    the first switch is configured to select, from the plurality of second rectifiers comprising the second polarity, a rectifier comprising a smaller area of a rectifying surface when an output signal of the amplifier changes from a first level to a second level that is higher than the first level.

7. The semiconductor device of claim 3, wherein the first switchable gain characteristic comprises a synthesis of the third gain characteristic and the fourth switchable gain characteristic of the at least one selected rectifier.

8. The semiconductor device of claim 7, wherein:
    the circuit comprising the second gain characteristic is an amplifier, and
    the first switch is configured to select, from the plurality of second rectifiers comprising the second polarity, a smaller number of rectifiers when an output signal of the amplifier changes from a first level to a second level that is higher than the first level.

9. The semiconductor device of claim 3, wherein the at least one first rectifier comprises a diode, and each of the plurality of second rectifiers comprises a diode.

10. The semiconductor device of claim 3, wherein:
    the at least one first rectifier comprises a transistor comprising a first conduction type, the transistor comprising:
    a gate terminal;
    a drain terminal connected to the gate terminal; and
    a source terminal connected to an input terminal of the circuit comprising the second gain characteristic;
    each of the plurality of second rectifiers comprising the second polarity comprises a transistor comprising a second conduction type, the transistor comprising:
    a gate terminal;
    a source terminal connected to the gate terminal; and
    a drain terminal connected to the input terminal of the circuit comprising the second gain characteristic; and
    the first switch comprises a plurality of switch elements configured to selectively connect the gate terminals of the plurality of transistors comprising the second type with a bias supply terminal.

11. The semiconductor device of claim 1, wherein the linearizer comprises a plurality of rectifiers comprising the first polarity and a second switch configured to select at least one of the rectifiers comprising the first polarity based on the control signal.

12. The semiconductor device of claim 11, wherein:
    each rectifier of the plurality of second rectifiers comprising the first polarity has a third gain and is configured to distort a first rectifier input in a manner different from that of the other rectifiers;
    each rectifier of the plurality of second rectifiers comprising the second polarity has a fourth gain characteristic and is configured to distort a second rectifier input in a manner different from that of the other rectifiers; and
    the first switchable gain characteristic comprises a synthesis of the third gain characteristic of the selected rectifier comprising the first polarity and the fourth gain characteristic of the selected rectifier comprising the second polarity.

13. The semiconductor device of claim 12, wherein
each rectifier of the plurality of second rectifiers comprising the first polarity has a rectifying surface comprising an area that is different from the other rectifiers; and
each rectifier of the plurality of second rectifiers comprising the second polarity has a rectifying surface comprising an area that is different from the other rectifiers.

14. The semiconductor device of claim 13, wherein
the circuit comprising the second gain characteristic is an amplifier; and
the first switch is configured to select, from the plurality of second rectifiers comprising the second polarity, a rectifier comprising a smaller area of the rectifying surface when an output signal of the amplifier changes from a first level to a second level that is higher than the first level;
the second switching is configured to select, from the plurality of rectifiers comprising the first polarity, a rectifier comprising a smaller area of the rectifying surface when an output signal of the amplifier changes from a first level to a second level that is higher than the first level.

15. The semiconductor device of claim 11, wherein the first gain switchable characteristic comprises a synthesis of a third gain characteristic of the one or more selected rectifiers comprising the first polarity and a fourth switchable gain characteristic of the one or more selected rectifiers comprising the second polarity.

16. The semiconductor device of claim 15, wherein:
the circuit comprising the second gain characteristic is an amplifier; and
the first switch is configured to select, from the plurality of second rectifiers comprising the second polarity, a smaller number of rectifiers when an output signal of the amplifier changes from a first level to a second level that is higher than the first level;
the second switching is configured to select, from the plurality of rectifiers comprising the first polarity, a smaller number of rectifiers when an output signal of the amplifier changes from a first level to a second level that is higher than the first level.

17. The semiconductor device of claim 11, wherein the at least one first rectifier comprises a diode, and each of the plurality of second rectifiers comprising the second polarity comprises a diode.

18. The semiconductor device of claim 11, wherein:
the at least one first rectifier comprises a transistor comprising a first conduction type, the transistor comprising:
a gate terminal;
a drain terminal connected to the gate terminal; and
a source terminal connected to an input terminal of the circuit comprising the second gain characteristic;
each of the plurality of second rectifiers comprising the second polarity comprises a transistor comprising a second conduction type, the transistor comprising:
a gate terminal;
a source terminal connected to the gate terminal; and
a drain terminal connected to the input terminal of the circuit comprising the second gain characteristic; and
the first switch comprises a plurality of switch elements configured to selectively connect the gate terminals of the plurality of transistors comprising the second type with a bias supply terminal; and
the first switch comprises a plurality of switch elements configured to selectively connect the gate terminals of the plurality of transistors comprising the first type with a bias supply terminal.

19. A semiconductor device configured to generate an intermediate signal from an input signal according to a first switchable gain characteristic, and to output the intermediate signal to a circuit comprising a second gain characteristic, the device comprising:
at least one first rectifier comprising a first polarity;
a plurality of second rectifiers comprising the first polarity and connected in parallel to the at least one first rectifier; and
a switch configured to select at least one rectifier from the plurality of second rectifiers based on a control signal.

20. A transmission and reception system comprising:
a macro linearizer configured to generate an intermediate signal from a modulated transmission signal or a reception signal to be demodulated, according to a first switchable gain characteristic, the macro linearizer comprising:
a linearizer configured to linearize the modulated transmission signal or the reception signal, the linearizer comprising at least one rectifier comprising a first polarity; and
a reducer configured to reduce linearization of the modulated transmission signal or the reception signal, the reducer comprising:
a plurality of rectifiers comprising a second polarity opposite to the first polarity; and
a first switch configured to select at least one of the rectifiers comprising the second polarity based on a control signal;
wherein the reducer is connected in parallel to the linearizer; and
an amplifier configured to be switchable between a plurality of gain characteristics, and to receive the intermediate signal;
a detector configured to detect a level of an output signal of the amplifier; and
a controller configured to control the amplifier and the linearizer according to the level of the output signal of the amplifier, and to generate a control signal configured to switch the first switchable gain characteristic and the plurality of gain characteristic in synchronization with each other.

* * * * *